(12) United States Patent
Nakamura

(10) Patent No.: US 9,099,546 B2
(45) Date of Patent: Aug. 4, 2015

(54) WORKPIECE DIVIDING METHOD INCLUDING TWO LASER BEAM APPLICATION STEPS

(75) Inventor: Masaru Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 74 days.

(21) Appl. No.: 13/275,878

(22) Filed: Oct. 18, 2011

(65) Prior Publication Data

US 2012/0100696 A1 Apr. 26, 2012

(30) Foreign Application Priority Data

Oct. 20, 2010 (JP) .................................. 2010-235745

(51) Int. Cl.
*H01L 21/00* (2006.01)
*H01L 21/78* (2006.01)

(52) U.S. Cl.
CPC ....................................... *H01L 21/78* (2013.01)

(58) Field of Classification Search
CPC . H01L 21/78; H01L 21/6835; H01L 21/6836; B23K 26/4075
USPC ......................................... 438/463, 460, 462
See application file for complete search history.

(56) References Cited

U.S. PATENT DOCUMENTS

| | | | | |
|---|---|---|---|---|
| 3,629,545 | A * | 12/1971 | Graham et al. | .......... 219/121.72 |
| 4,722,130 | A * | 2/1988 | Kimura et al. | .................. 29/413 |
| 6,333,485 | B1 * | 12/2001 | Haight et al. | ............ 219/121.68 |
| 6,544,865 | B1 * | 4/2003 | Basore et al. | ................. 438/460 |
| 7,087,463 | B2 * | 8/2006 | Sackrison et al. | ............ 438/113 |
| 7,211,526 | B2 * | 5/2007 | Iri et al. | ........................ 438/797 |
| 7,241,667 | B2 * | 7/2007 | Park et al. | ..................... 438/458 |
| 7,566,635 | B2 * | 7/2009 | Fujii et al. | ..................... 438/462 |
| 7,572,657 | B2 * | 8/2009 | Yakushiji | ......................... 438/33 |
| 7,754,584 | B2 * | 7/2010 | Kumakawa | ................... 438/463 |
| 7,825,350 | B2 * | 11/2010 | Fukuyo et al. | .......... 219/121.72 |
| 2003/0213770 | A1 * | 11/2003 | Yamada et al. | ................ 216/65 |
| 2004/0002199 | A1 * | 1/2004 | Fukuyo et al. | ................ 438/460 |
| 2005/0059183 | A1 * | 3/2005 | Nagai et al. | ..................... 438/33 |
| 2005/0263854 | A1 * | 12/2005 | Shelton et al. | ................ 257/615 |

(Continued)

FOREIGN PATENT DOCUMENTS

| | | | |
|---|---|---|---|
| JP | 2002-192370 | 7/2002 | |
| JP | 2005-086161 | 3/2005 | ............ H01L 21/301 |

(Continued)

*Primary Examiner* — Lex Malsawma
*Assistant Examiner* — Eric Jones
(74) *Attorney, Agent, or Firm* — Greer Burns & Crain, Ltd.

(57) ABSTRACT

A dividing method for a workpiece having a substrate with a film formed on the front side thereof. A first laser beam is applied to the film from the front side of the workpiece along the streets formed on the film, thereby forming a plurality of laser processed grooves along the streets to cut the film along the streets. Thereafter, an adhesive tape is attached to the front side of the workpiece. Thereafter, a second laser beam is applied to the substrate from the back side of the workpiece along the streets in the condition where the focal point of the second laser beam is set inside the substrate, thereby forming a plurality of modified layers inside the substrate along the streets. Thereafter, the adhesive tape is expanded to thereby divide the substrate along the streets, thereby obtaining a plurality of individual devices. Thereafter, the back side of the substrate of each device is ground to remove the modified layers and reduce the thickness of each device to a predetermined thickness.

8 Claims, 4 Drawing Sheets

(56) References Cited

U.S. PATENT DOCUMENTS

| | | |
|---|---|---|
| 2006/0099810 A1* | 5/2006 | Voronov et al. ............... 438/689 |
| 2008/0026497 A1* | 1/2008 | Furuya ............................ 438/22 |
| 2008/0121906 A1* | 5/2008 | Yakushiji ........................ 257/94 |
| 2009/0121337 A1* | 5/2009 | Abe et al. ....................... 257/686 |
| 2009/0224432 A1* | 9/2009 | Nagatomo et al. ............. 264/400 |
| 2009/0311848 A1* | 12/2009 | Hoshino et al. ................ 438/463 |
| 2010/0044590 A1* | 2/2010 | Aikawa ...................... 250/492.2 |
| 2010/0102341 A1* | 4/2010 | Tsutsumi et al. ............... 257/98 |
| 2012/0156858 A1* | 6/2012 | Sekiya .......................... 438/458 |
| 2014/0099777 A1* | 4/2014 | Mackh et al. .................. 438/463 |

FOREIGN PATENT DOCUMENTS

| | | | |
|---|---|---|---|
| JP | 2005-116844 | 4/2005 | ............ H01L 21/301 |
| JP | 2007-134454 | 5/2007 | ............ H01L 21/301 |

* cited by examiner

WORKPIECE DIVIDING METHOD INCLUDING TWO LASER BEAM APPLICATION STEPS

BACKGROUND OF THE INVENTION

1. Field of the Invention

The present invention relates to a workpiece dividing method suitably applicable in the case of dividing a workpiece such as a semiconductor wafer to obtain a plurality of devices.

2. Description of the Related Art

In a semiconductor device fabrication process, a plurality of crossing division lines called streets are formed on the front side of a workpiece such as a disk-shaped semiconductor wafer to thereby partition a plurality of rectangular device regions where a plurality of devices such as ICs, LSIs, liquid crystal drivers, and flash memories are respectively formed on the front side. After grinding the back side of the workpiece and next performing necessary processing such as polishing, the workpiece is cut along the streets to divide the device regions, thus obtaining the individual devices.

In general, the division of the workpiece is performed by using a cutting apparatus called a dicing saw having a cutting blade, wherein the cutting blade is rotated at a high speed and fed in the workpiece. In recent years, a laser processing method has also been adopted, wherein a laser beam is applied to the workpiece in the condition where the focal point of the laser beam is set inside a region of the workpiece to be divided. According to a workpiece dividing method using this laser processing method, a pulsed laser beam having a transmission wavelength to the workpiece is applied to the workpiece from one side thereof along the streets in the condition where the focal point of the pulsed laser beam is set inside the workpiece, thereby continuously forming a modified layer inside the workpiece along each street. Thereafter, an external force is applied to the workpiece along the streets where the modified layers are formed to reduce the strength, thereby breaking the workpiece along the streets. For example, this dividing method has an advantage such that the width of each street can be reduced (see Japanese Patent No. 3408805, for example).

SUMMARY OF THE INVENTION

In the above related-art method of dividing a workpiece by applying a laser beam to the workpiece to form the modified layers in the workpiece, there is a problem such that when a film such as a metal film is present on the streets of the workpiece, the film is hard to break. Further, there is another problem such that the modified layers remain on the side surfaces of each device obtained by dividing the workpiece, causing a reduction in die strength of each device.

It is therefore an object of the present invention to provide a workpiece dividing method which can divide the workpiece even when a film such as a metal film is present on the streets of the workpiece and can improve the die strength of each device obtained by dividing the workpiece over the related art.

In accordance with an aspect of the present invention, there is provided a workpiece dividing method for dividing a workpiece along a plurality of crossing streets into each device, the workpiece having a substrate and a film formed on the front side of the substrate, the streets being formed on the front side of the film to partition the substrate into a plurality of regions where a plurality of devices are respectively formed, the workpiece dividing method including a film cutting step of applying a first laser beam having an absorption wavelength to the film from the front side of the workpiece along the streets to form a plurality of laser processed grooves along the streets, thereby cutting the film along the streets; a tape mounting step of attaching the front side of the workpiece to an adhesive tape supported to an annular frame so as to close an opening thereof after performing the film cutting step; a modified layer forming step of applying a second laser beam having a transmission wavelength to the substrate from the back side of the workpiece along the streets in the condition where the focal point of the second laser beam is set inside the substrate after performing the tape mounting step, thereby forming a plurality of modified layers inside the substrate along the streets; a dividing step of expanding the adhesive tape to apply an external force to the substrate after performing the modified layer forming step, thereby dividing the substrate along the streets; and a back grinding step of grinding the back side of the substrate to remove the modified layers after performing the dividing step.

According to the present invention, the film present on the streets is cut in the film cutting step. Accordingly, the substrate can be smoothly divided without the influence of the film in the dividing step to be performed after the film cutting step. Further, in the back grinding step subsequent to the dividing step, the modified layers are removed by grinding. Accordingly, a reduction in die strength of each device due to the presence of the modified layers can be prevented and each device is improved in die strength over the related art. The substrate mentioned in the present invention is not especially limited. Examples of the substrate include a semiconductor wafer such as a silicon (Si) wafer, gallium arsenide (GaAs) wafer, and silicon carbide (SiC) wafer and an inorganic material substrate such as a glass substrate and sapphire ($Al_2O_3$) substrate.

The film mentioned in the present invention is also not especially limited. Examples of the film include a metal film, fluorosilicate glass film, silicon oxide passivation film ($SiO_2$, SiON), polyimide (PI) high-molecular compound film, fluorinated high-molecular compound film, and fluorinated amorphous carbon compound film. Each modified layer mentioned in the present invention means a region different from its ambient region in density, refractive index, mechanical strength, or any other physical properties. Examples of each modified layer include a melted layer, cracked layer, breakdown layer, and refractive index changed layer. These layers may be present solely or in combination.

According to the present invention, even when the film such as a metal film is present on the streets of the workpiece, the workpiece can be divided. Further, the die strength of each device obtained by dividing the workpiece can be improved over the related art.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
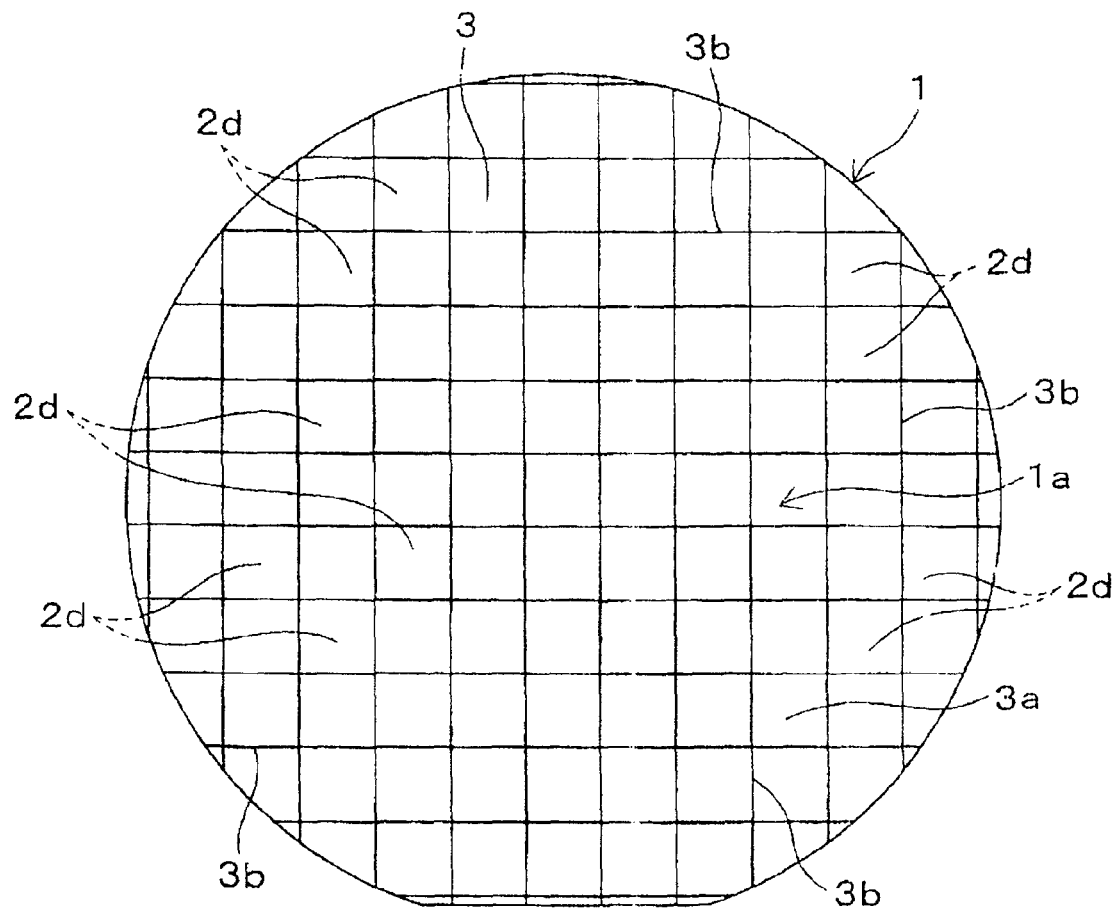
FIG. 1A is a plan view of a workpiece to be divided into a plurality of devices by a dividing method according to a preferred embodiment of the present invention.

A preferred embodiment of the present invention will now be described in detail with reference to the drawings. Reference numeral 1 in FIG. 1A generally denotes a disk-shaped workpiece to be divided by a dividing method according to a preferred embodiment of the present invention. As shown in FIG. 1B, the workpiece 1 is composed of a disk-shaped substrate 2 such as a semiconductor wafer and a film 3 formed on the front side 2a of the substrate 2. The substrate 2 has a thickness of about 600 to 700 µm, for example, and the film 3 has a thickness of about 20 to 30 µm, for example.

Figure 1B:
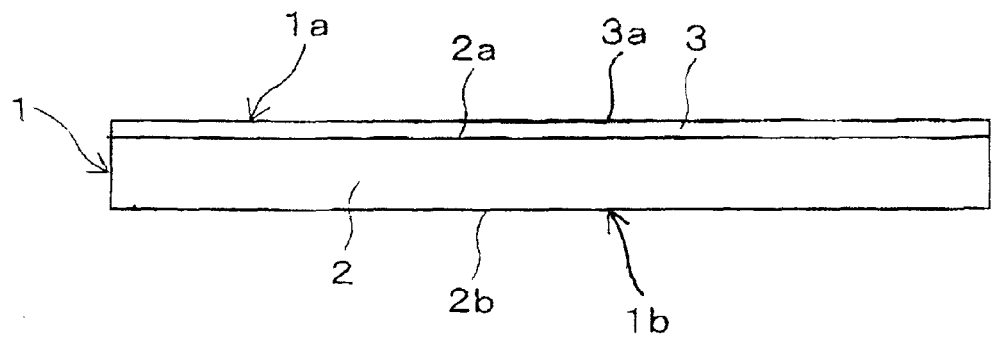
FIG. 1B is a side view of the workpiece shown in FIG. 1A.

As shown in FIG. 1A, a plurality of crossing streets 3b are formed on the front side 3a of the film 3 to thereby partition the substrate 2 into a plurality of rectangular device regions 2d. A device (not shown) such as IC, LSI, liquid crystal driver, and flash memory is formed on the front side of each device region 2d. The film 3 is formed from a metal film, fluorosilicate glass film, etc. as mentioned above. The film 3 is formed on the entire surface of the front side 2a of the substrate 2. This preferred embodiment relates to a method of dividing the workpiece 1 having the film 3 formed on the front side 2a of the substrate 2 along the streets 3b to separate the device regions 2d from each other. This method will now be described in the sequence of steps.

Figure 2A:
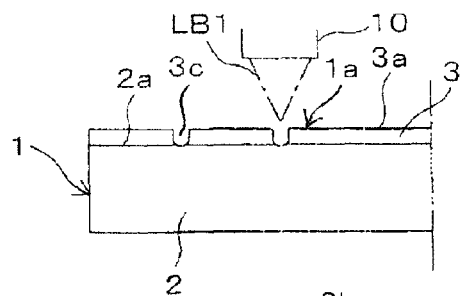
FIGS. 2A to 2F are side views sequentially showing the steps of the dividing method according to this preferred embodiment.

FIGS. 2A to 2F show the sequence of the steps of this method. First, the positions of the streets 3b are detected from the front side 1a of the workpiece 1 by imaging means (not shown). As shown in FIGS. 2A and 3, laser applying means 10 is next operated to apply a pulsed laser beam LB1 having an absorption wavelength to the film 3 from the front side 1a of the workpiece 1, i.e., from the front side 3a of the film 3 along the streets 3b as scanning the laser beam LB1 along the streets 3b to form a plurality of laser processed grooves 3c along the streets 3b, thereby cutting the film 3 along the streets 3b (film cutting step). The arrow shown in FIG. 3 denotes a scanning direction of the laser beam LB1. The scanning of the laser beam LB1 is performed by relatively moving the laser applying means 10 and the workpiece 1 along the streets 3b.

By applying the laser beam LB1 to the film 3, the film 3 is subjected to ablation such that the components of the film 3 are melted and evaporated, thereby forming the laser processed grooves 3c along the streets 3b in the film 3. Thus, such ablation of the film 3 by the application of the laser beam LB1 is performed along all of the streets 3b to thereby cut the film 3 along all of the streets 3b.

For example, the laser beam LB1 is applied to the film 3 under the following conditions in the film cutting step.

Wavelength: 355 nm
Power: 0.5 W
Frequency: 120 kHz
Pulse width: 210 ns
Scanning speed: 300 mm/s The focal point of the laser beam LB1 in the film cutting step is set at a position slightly above the front side 3a of the film 3 (e.g., a position spaced apart by 0.03 µm from the front side 3a of the film 3, depending on the thickness of the film 3). The processing conditions of the ablation are set so that the substrate 2 is almost not ablated. Accordingly, almost no damage to the substrate 2 is caused to thereby prevent a reduction in die strength of the substrate 2.

Figure 2B:
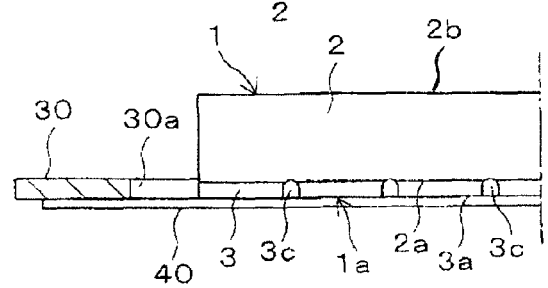
Figure 3:
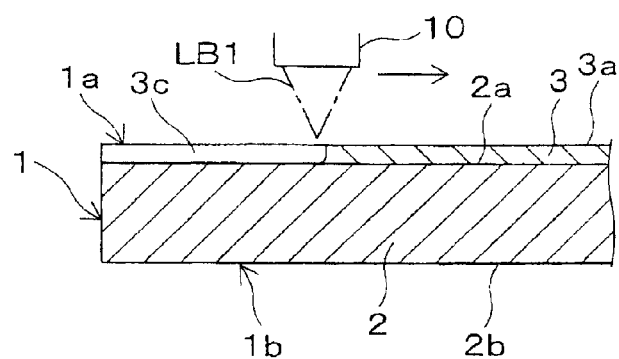
FIG. 3 is a sectional view showing a film cutting step in the dividing method according to this preferred embodiment.
Figure 4:
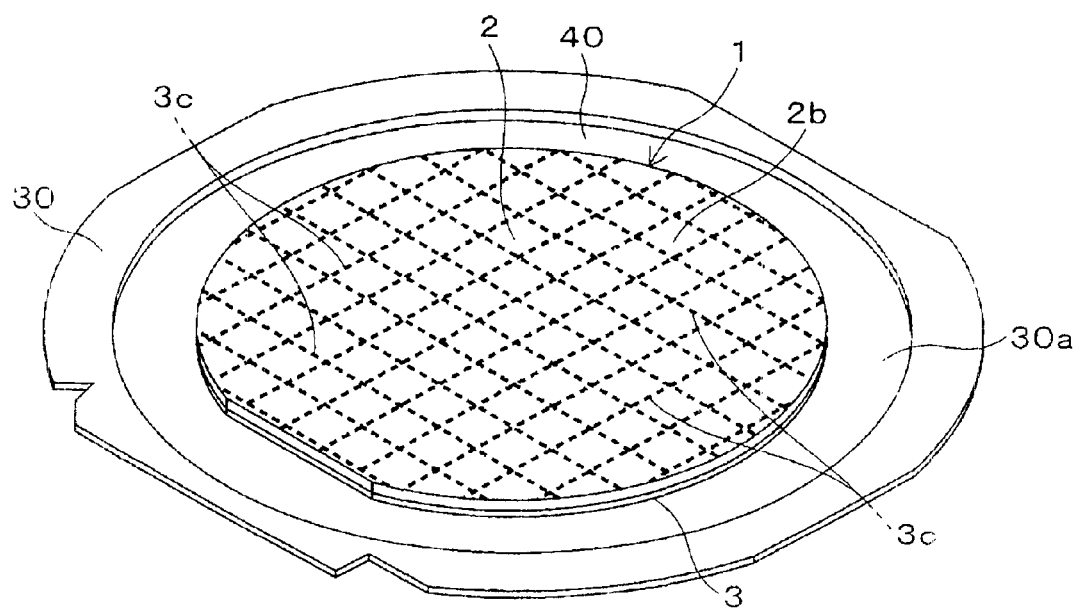
FIG. 4 is a perspective view showing a condition that the front side of the workpiece is attached to an adhesive tape supported to an annular frame in a tape mounting step.

As shown in FIGS. 2B and 4, the front side 1a of the workpiece 1 is next attached to an adhesive tape 40 supported to an annular frame 30 so as to close a circular opening 30a thereof (tape mounting step). The adhesive tape 40 is composed of a base sheet formed of synthetic resin such as polyethylene and an adhesive layer formed on one side of the annular frame 30. One side of the annular frame 30 is attached to the adhesive layer of the adhesive tape 40. The front side 1a of the workpiece 1 is attached to the adhesive layer of the adhesive tape 40 supported to the annular frame 30 in such a manner that the workpiece 1 is positioned in concentric relationship with the circular opening 30a of the annular frame 30. As shown in FIGS. 2B and 4, the adhesive layer of the adhesive tape 40 is oriented upward and the front side 1a of the workpiece 1 is oriented downward to be attached to the adhesive layer of the adhesive tape 40. The annular frame 30 is formed from a rigid plate such as a metal plate. Accordingly, the workpiece 1 is handled by supporting the annular frame 30.

Figure 2C:
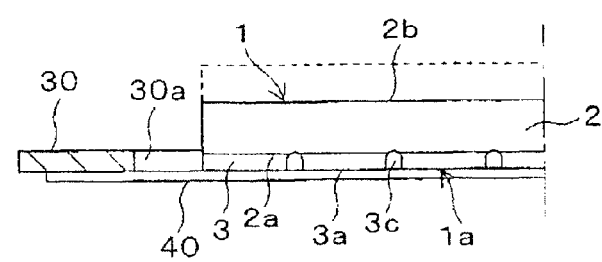

After attaching the front side 1a of the workpiece 1 to the adhesive tape 40 supported to the annular frame 30 as mentioned above, the back side 2b of the substrate 2 is ground as shown in FIG. 2C to reduce the thickness of the substrate 2 to a predetermined thickness (e.g., 100 to 200 µm) such that the substrate 2 can be divided in a subsequent dividing step. In FIG. 2C, the broken line shows a portion of the substrate 2 removed by grinding the back side 2b of the substrate 2. The grinding of the back side 2b of the substrate 2 is performed by suitably using a grinding apparatus including a rotatable holding table for holding the workpiece 1 an a rotatable grinding wheel having abrasive members, wherein the holding table holding the workpiece 1 is rotated to rotate the workpiece 1 and the grinding wheel is rotated and fed to be pressed on the back side 2b of the substrate 2.

Figure 2D:
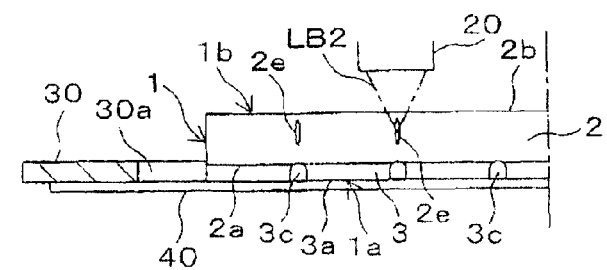
Figure 5:
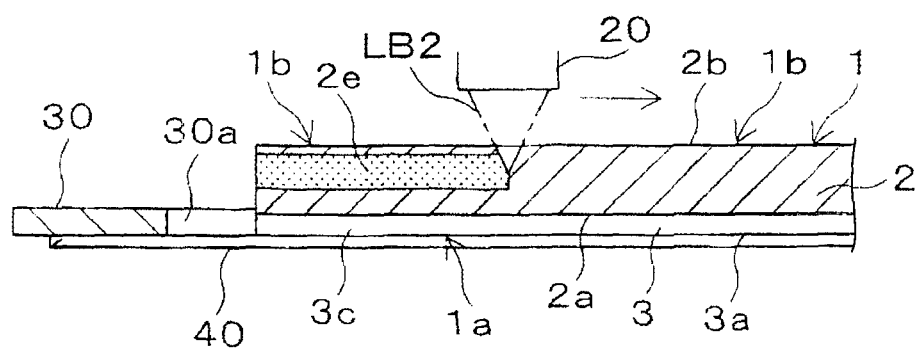
FIG. 5 is a sectional view showing a modified layer forming step in the dividing method according to this preferred embodiment.

After grinding the back side 2b of the substrate 2 to reduce the thickness of the substrate 2 to a predetermined thickness as mentioned above, laser beam applying means 20 is operated as shown in FIGS. 2D and 5 to apply a pulsed laser beam LB2 having a transmission wavelength to the substrate 2 from the back side 1b of the workpiece 1, i.e., from the back side 2b of the substrate 2 along the streets 3b as scanning the laser beam LB2 along the streets 3b in the condition where the focal point of the laser beam LB2 is set inside the substrate 2, thereby forming a plurality of modified layers 2e inside the substrate 2 along the streets 3b (modified layer forming step). The arrow shown in FIG. 5 denotes a scanning direction of the laser beam LB2. The scanning of the laser beam LB2 is performed by relatively moving the laser beam applying means 20 and the workpiece 1 along the streets 3b. As described above, each modified layer 2e is a melted layer, cracked layer, etc., different in physical properties from its ambient region, wherein these layers are present solely or in combination. These modified layers 2e are formed in the substrate 2 along all of the streets 3b.

For example, the laser beam LB2 is applied to the substrate 2 under the following conditions in the modified layer forming step.

Wavelength: 1064 nm
Power: 1.0 W
Frequency: 80 kHz
Pulse width: 150 ns
Scanning speed: 300 mm/s The focal point of the laser beam LB2 to be applied to the substrate 2 is adjusted in position from the back side 2b of the substrate 2 by moving a focusing lens included in the laser beam applying means 20 toward the back side 2b from the condition where the focal point is set on the back side 2b, thereby moving the focal point set on the back side 2b toward the front side 2a of the substrate 2. The amount of movement of the focusing lens toward the back side 2b is set to about 15 μm, for example, depending on the thickness of the workpiece 1. The modified layers 2e are formed in a region of the substrate 2 to be ground in a subsequent back grinding step.

Figure 2E:
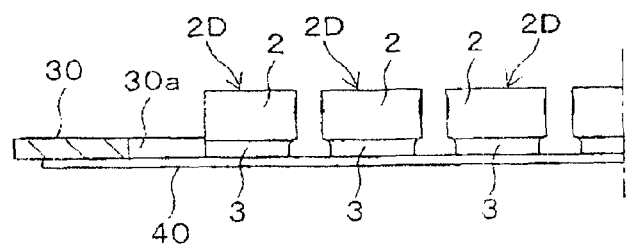

After forming the modified layers 2e in the substrate 2 along all of the streets 3b, the adhesive tape 40 is expanded to apply an external force to the substrate 2, thereby dividing the substrate 2 along the streets 3b as shown in FIG. 2E (dividing step). The substrate 2 is divided along the streets 3b in such a manner that the division is started from the modified layers 2e having physical properties different from those in its ambient region, so that the device regions 2d of the substrate 2 are separated into a plurality of individual devices 2D.

Figure 2F:
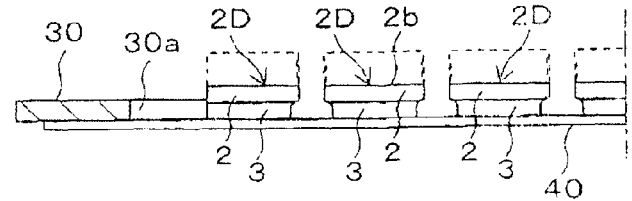

Thereafter, as shown in FIG. 2F, the back side 2b of the substrate 2 of each device 2D is ground as shown by the broken line to reduce the thickness of each device 2D to a predetermined thickness and remove the modified layers 2e (back grinding step). The final thickness of each device 2D is set to about 50 μm, for example. This back grinding step is performed by suitably using the grinding apparatus as described above. Thereafter, each device 2D is picked up and mounted on predetermined equipment. In such a pickup step, the back side 2b of each device 2D obtained after the back grinding step shown in FIG. 2F is attached to a pickup adhesive tape (not shown), and the adhesive tape 40 is next peeled off to expose the film 3. Thereafter, each device 2D is peeled off from the pickup adhesive tape.

In the case that an adhesive film called a DAF (Die Attach Film) for bonding must be provided on the back side 2b of each device 2D, the following step is added. That is, the pickup adhesive tape is attached through the adhesive film to the back side 2b of each device 2D. Thereafter, the adhesive film is divided along the boundary between the devices 2D. Thereafter, each device 2D is picked up together with the adhesive film. The division of the adhesive film is performed by ablation using a laser beam as in the film cutting step mentioned above or by expanding the adhesive film to apply an external force and break the adhesive film. In the case of expanding the adhesive film, the expansion is preferably performed in a cooled condition to facilitate the breakage of the adhesive film.

According to the dividing method described above, the film 3 is cut along the streets 3b in the film cutting step prior to the dividing step. Accordingly, in the dividing step, the substrate 2 can be smoothly divided along the streets 3b without the influence of the film 3. That is, even when the film 3 such as a metal film is present on the streets 3b of the workpiece 1, the workpiece 1 can be divided. Further, in the back grinding step subsequent to the dividing step, the modified layers 2e are removed by grinding. Accordingly, the modified layers 2e are not present in each device 2D as a final product, so that a reduction in die strength of each device 2D due to the modified layers 2e can be prevented and each device 2D is improved in die strength over the related art.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece dividing method for dividing a workpiece along a plurality of crossing streets into each device, said workpiece having a substrate and a metal film formed on the front side of said substrate, said streets being formed on the front side of said metal film to partition said substrate into a plurality of regions where a plurality of devices are respectively formed, said workpiece dividing method comprising:
   a metal film cutting step of applying a first laser beam having an absorption wavelength to said metal film from the front side of said workpiece along said streets to form a plurality of laser processed grooves along said streets, thereby completely cutting through said metal film along said streets to expose said substrate, wherein during said metal film cutting step, the focal point of the first laser beam is set at a position slightly above the metal film, and said substrate is at most only minimally ablated by said first laser beam;
   a tape mounting step of attaching the front side of said workpiece to an adhesive tape supported by an annular frame after performing said metal film cutting step;
   a modified layer forming step of applying a second laser beam having a transmission wavelength to said substrate from the back side of said workpiece along said streets in the condition where the focal point of said second laser beam is set inside said substrate after performing said tape mounting step, thereby forming a plurality of modified layers inside said substrate along said streets;
   a dividing step of expanding said adhesive tape to apply an external force to said substrate after performing said modified layer forming step, thereby dividing said substrate along said streets; and
   a back grinding step of grinding the back side of said substrate to remove said modified layers after performing said dividing step,
   wherein during said back grinding step, said modified layers are removed by reducing the thickness of the substrate to a predetermined thickness by using a rotatable grinding wheel, without reducing the length or width of individual devices of the divided substrate.

2. The workpiece dividing method according to claim 1, wherein during said metal film cutting step, the focal point of the first laser beam is spaced apart from the metal film by 0.03 μm.

3. The workpiece dividing method according to claim 1, wherein prior to the metal film cutting step, the metal film extends continuously along the streets.

4. The workpiece dividing method according to claim 1, wherein prior to the metal film cutting step, the metal film substantially covers the front side of said substrate.

5. The workpiece dividing method according to claim 1, further comprising a step of reducing the thickness of said substrate by grinding said substrate, wherein said step of reducing the thickness of said substrate is performed after said tape mounting step but before said modified layer forming step.

6. The workpiece dividing method according to claim 5, wherein:
   said step of reducing the thickness of said substrate involves grinding said substrate to a first predetermined thickness of between 100 μm to 200 μm; and
   said back grinding step involves grinding said substrate to a second predetermined thickness, wherein said second predetermined thickness is different than said first predetermined thickness.

7. The workpiece dividing method according to claim 6, wherein said second predetermined thickness is 50 μm.

8. A workpiece dividing method for dividing a workpiece along a plurality of crossing streets into each device, said workpiece having a substrate and a metal film formed on the front side of said substrate, said streets being formed on the front side of said metal film to partition said substrate into a plurality of regions where a plurality of devices are respectively formed, said workpiece dividing method comprising:

- a metal film cutting step of applying a first laser beam having an absorption wavelength to said metal film from the front side of said workpiece along said streets to form a plurality of laser processed grooves along said streets, thereby completely cutting through said metal film along said streets to expose said substrate, wherein during said metal film cutting step, the focal point of the first laser beam is set at a position slightly above the metal film, and said substrate is at most only minimally ablated by said first laser beam;
- a tape mounting step of attaching the front side of said workpiece to an adhesive tape supported by an annular frame after performing said metal film cutting step;
- a modified layer forming step of applying a second laser beam having a transmission wavelength to said substrate from the back side of said workpiece along said streets in the condition where the focal point of said second laser beam is set inside said substrate after performing said tape mounting step, thereby forming a plurality of modified layers inside said substrate along said streets;
- a dividing step of expanding said adhesive tape to apply an external force to said substrate after performing said modified layer forming step, thereby dividing said substrate along said streets; and
- a back grinding step of grinding the back side of said substrate to remove said modified layers after performing said dividing step, wherein during said metal film cutting step, the metal film is subject to ablation by the first laser beam, thereby melting and evaporating the portions of the metal film to which the first laser beam has been applied.

* * * * *